(12) United States Patent
Lin et al.

(10) Patent No.: US 7,753,106 B2
(45) Date of Patent: Jul. 13, 2010

(54) HEAT DISSIPATION DEVICE

(75) Inventors: Yu-Chen Lin, Tu Cheng (TW); Hong-Bo Xu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 1093 days.

(21) Appl. No.: 11/308,866

(22) Filed: May 16, 2006

(65) Prior Publication Data

US 2007/0084595 A1 Apr. 19, 2007

(30) Foreign Application Priority Data

Oct. 14, 2005 (CN) .................... 2005 1 0100374

(51) Int. Cl.
*H05K 7/20* (2006.01)
(52) U.S. Cl. .................. 165/80.3; 165/185; 361/704
(58) Field of Classification Search ............... 165/80.3, 165/185; 361/704
See application file for complete search history.

(56) References Cited

U.S. PATENT DOCUMENTS

| 4,633,371 | A | 12/1986 | Nagy et al. |
| 6,330,908 | B1 | 12/2001 | Lee et al. |
| 6,543,522 | B1 * | 4/2003 | Hegde .................. 165/80.3 |
| 6,657,865 | B1 * | 12/2003 | Tseng et al. ............. 361/709 |
| 6,691,770 | B2 * | 2/2004 | Wagner ................ 165/104.33 |
| 7,063,130 | B2 | 6/2006 | Huang |
| 7,296,619 | B2 * | 11/2007 | Hegde ................. 165/104.33 |
| 2004/0118552 | A1 * | 6/2004 | Huang et al. ............. 165/80.3 |
| 2005/0061478 | A1 * | 3/2005 | Huang .................... 165/80.3 |
| 2005/0088821 | A1 * | 4/2005 | Lee et al. ................ 361/697 |
| 2005/0161196 | A1 * | 7/2005 | Hsieh .................... 165/80.3 |
| 2006/0225866 | A1 * | 10/2006 | Chen ..................... 165/80.3 |

FOREIGN PATENT DOCUMENTS

| TW | M264823 | 5/2005 |
| TW | M269700 | 7/2005 |

\* cited by examiner

*Primary Examiner*—Leonard R Leo
(74) *Attorney, Agent, or Firm*—Jeffrey T. Knapp (57) ABSTRACT

A heat dissipation device includes a heat conducting member (10) adapted for contacting with a heat generating electronic device and a fin unit (30). The fin unit defines a central hole (300) therein and consists of a plurality of fins (31) around the central hole and clasping each other. The fin unit fits around a periphery of the heat conducting member via the heat conducting member extending in the central hole of the fin unit. A clip (40) engages with the heat conducting member and the fin unit for providing a pressure to the fin unit such that the fin unit is intimately fastened to the heat conducting member.

18 Claims, 8 Drawing Sheets

HEAT DISSIPATION DEVICE

FIELD OF THE INVENTION

The present invention relates in general to a heat dissipation device used in association with electronic components.

DESCRIPTION OF RELATED ART

With advancement of computer technology, electronic components operate rapidly. It is well known that when the electronic components have become smaller and faster, they generate more heat than ever. If the heat is not dissipated duly, the stability of the operation of the electronic components will be impacted severely. Generally, in order to ensure the electronic components to run normally, heat sinks are used extensively in connection with electronic components. U.S. Pat. No. 5,794,685 discloses an electronic component cooling apparatus. The cooling apparatus includes a heat sink having a cylindrical core and a plurality of radiation fins integrally extending outwards from the core. The radiation fins are formed so as to be limited in their thickness, and a space between two neighboring fins is also limited during manufacture such that number of the fins is limited correspondingly. Such construction fails to provide a sufficient amount of area of fins for radiating the heat, resulting in an insufficient heat dissipation.

SUMMARY OF THE INVENTION

A heat dissipation device in accordance with an embodiment includes a heat conducting member adapted for contacting with a heat generating electronic device and a fin unit. The fin unit defines a central hole therein and consists of a plurality of fins around the central hole and clasping each other. The fin unit fits around a periphery of the heat conducting member via the heat conducting member extending in the central hole of the fin unit. A clip engages with the heat conducting member and the fin unit for providing a pressure to the fin unit such that the fin unit is intimately fastened to the heat conducting member.

Other advantages and novel features will become more apparent from the following detailed description of preferred embodiments when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
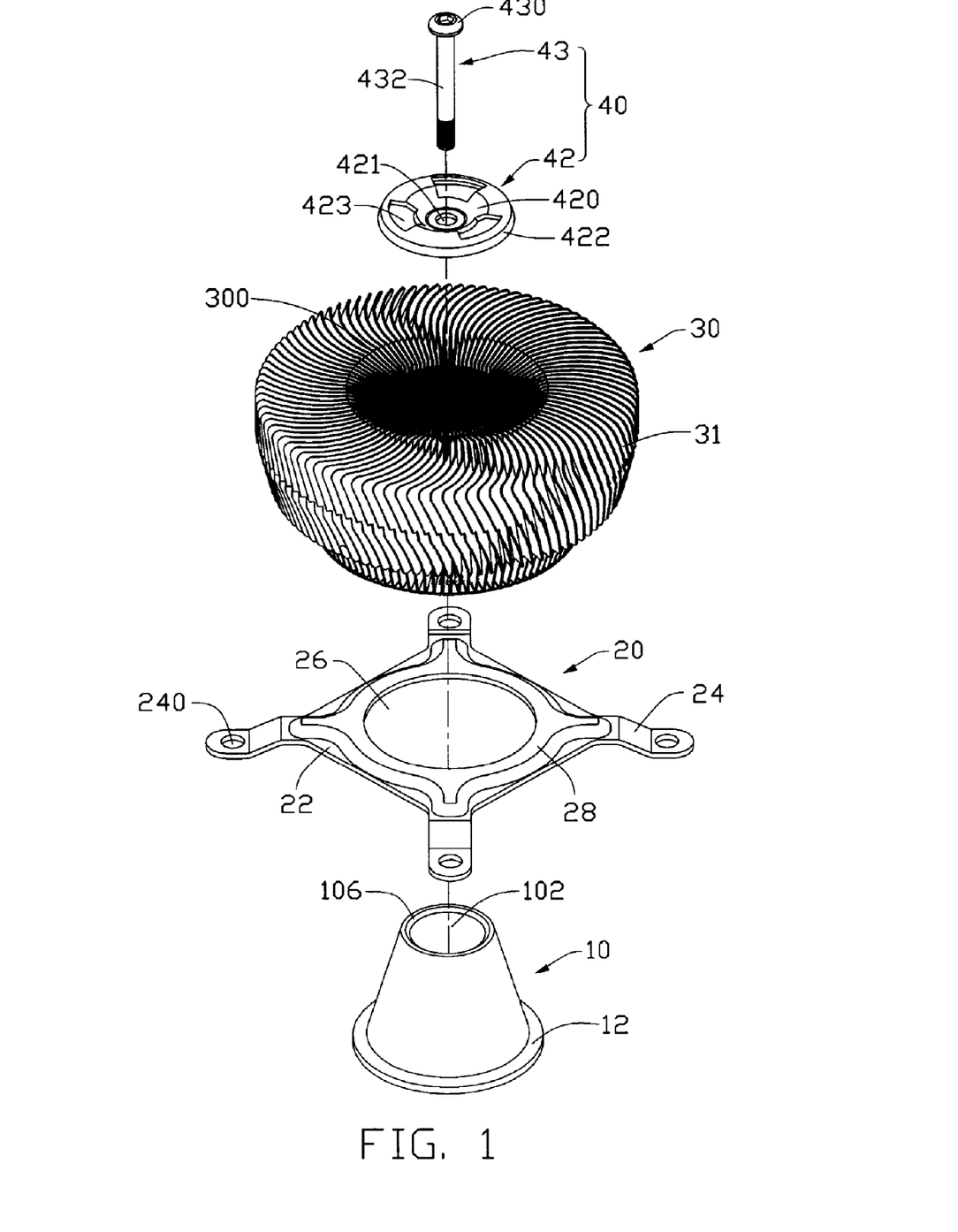
FIG. 1 is an exploded, isometric view of a heat dissipation device in accordance with a preferred embodiment of the present invention.
Figure 2:
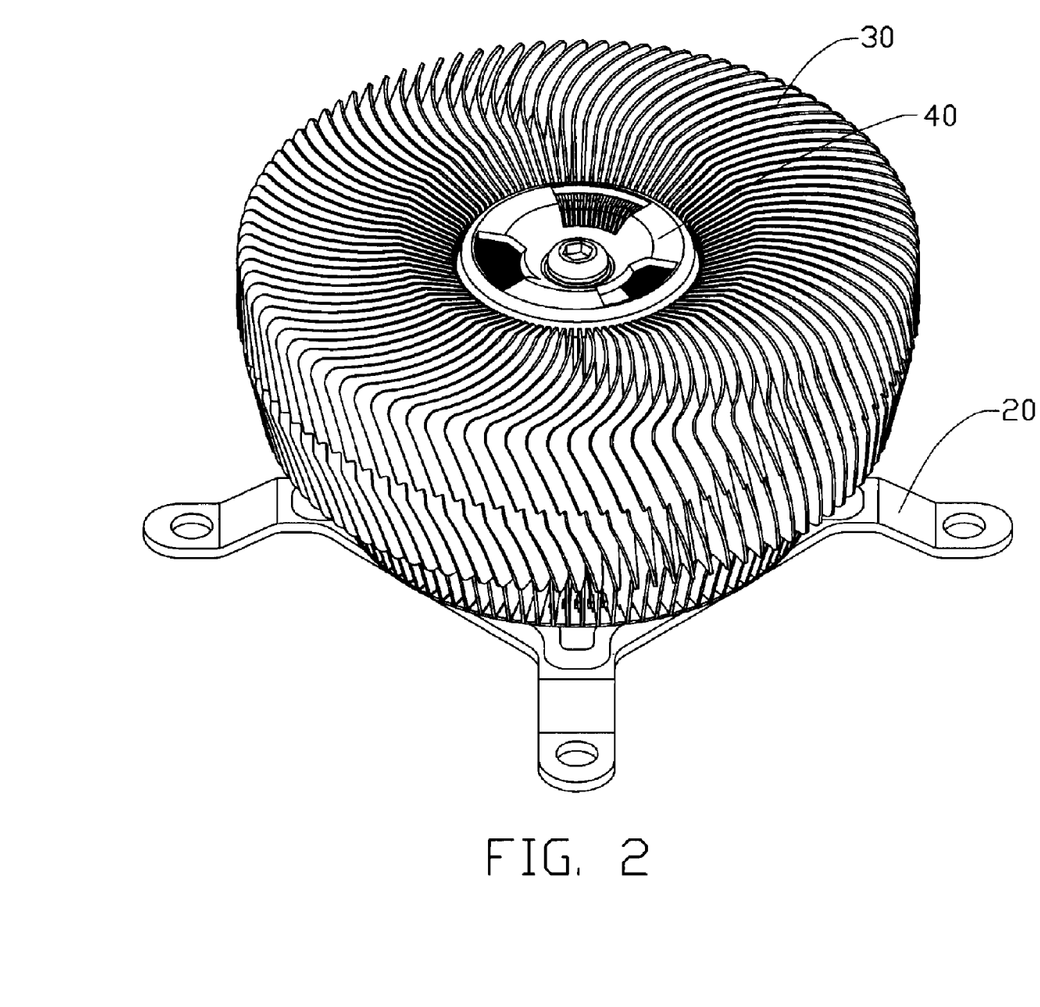
FIG. 2 is an assembled view of FIG. 1
Figure 3:
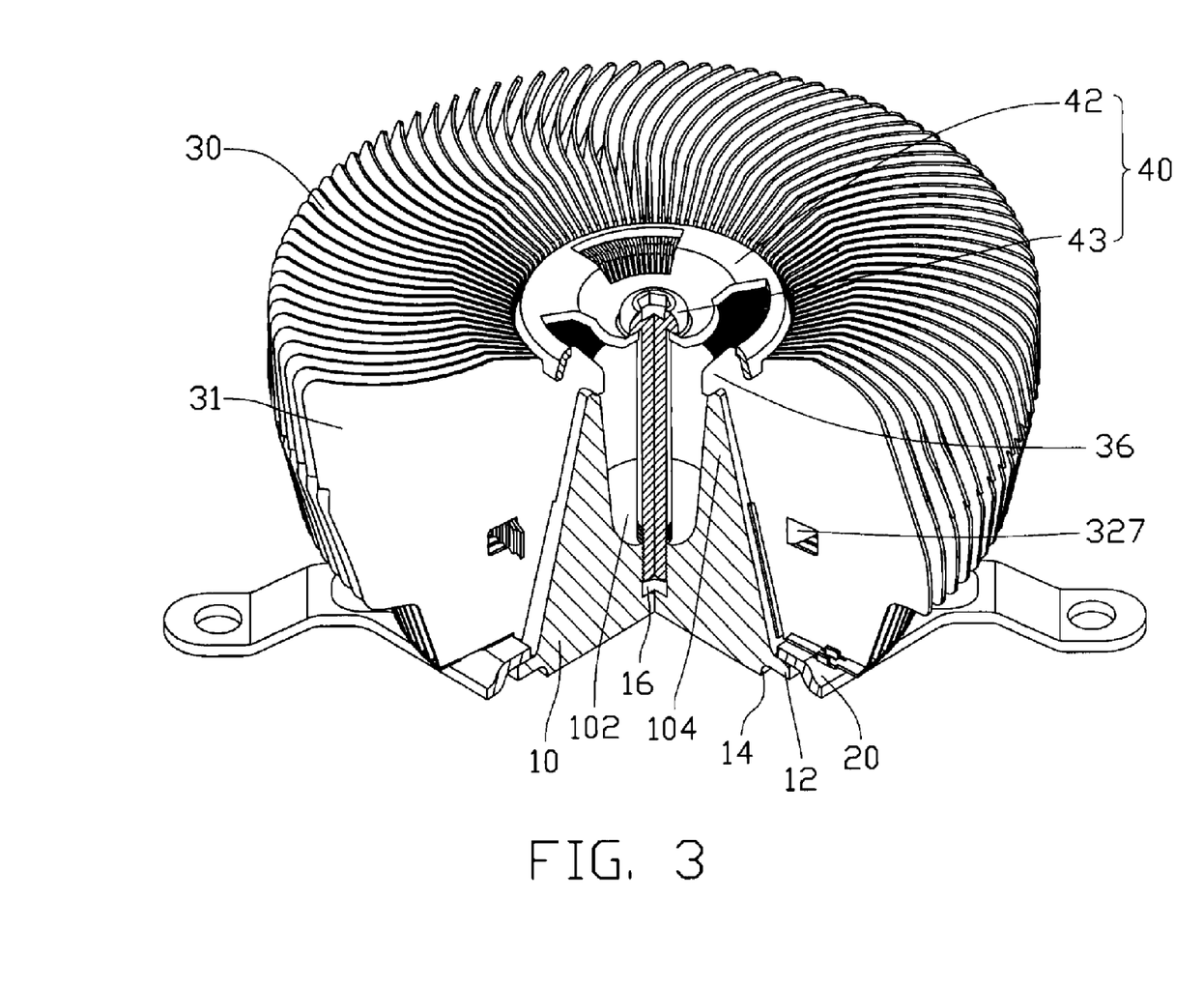
FIG. 3 is a view similar to FIG. 2 with a part thereof being cut away.

Referring to FIGS. 1-3, a heat dissipation device in accordance with a preferred embodiment of the present invention is shown. The heat dissipation device comprises a fin unit 30, a heat conducting member 10 received in the fin unit 30, a locking plate 20 combined to a bottom of the heat conducting member 10, and a clip 40 for securing the fin unit 30 to the heat conducting member 10.

The heat conducting member 10 is a frustum which is formed from a cone with a circular base by cutting off a tip of the cone with a cut perpendicular to the height, forming a lower base (not labeled) and an upper base (not labeled) that are circular and parallel to each other. The lower base has a bigger cross-section than that of the upper base and forms an annular pad 12 extending outwardly from an outer surface thereof. A protrusion 14 (shown in FIG. 3) is formed on a bottom of the lower base, for engaging with a heat generating electronic device (not show) located on a printed circuit board (not show). The heat conducting member 10 defines an opening 102 in a top portion thereof having a radius gradually decreased along a top-bottom direction, such that a wall 104 having a thickness gradually increased along the top-bottom direction is formed around the opening 102. The wall 104 has an inclined surface 106 at an inner surface adjacent to a top thereof. An angle between the inclined surface 106 and an outer surface of the wall 104 is bigger than an angle between the inner surface of the wall 104 and the outer surface of the wall 104. A bottom of the wall 104 defines a threaded hole 16 located below the opening 102. The opening 102 is so configured as to reduce the weight of the heat dissipation device and save the cost of the heat dissipation device.

The locking plate 20 comprises a substantially rectangular body 22 and four fixing legs 24 extending outwardly and downwardly from four corners of the body 22. Each of the legs 24 has a fixing hole 240 defined in a distal end thereof for fittingly receiving a fastener (not shown) therein. The fasteners are used to attach the heat dissipation device to the printed circuit board. The body 22 has a circular opening 26 defined in a center thereof. A diameter of the opening 26 is smaller than an outer diameter of the annular pad 12. A gap (not labeled) is formed between an inner surface of the opening 26 and an outer circumferential surface of the heat conducting member 10 when the locking plate 20 is mounted on the annular pad 12. An engaging portion 28 of the body 22 around the opening 26 is embossed on the locking plate 20. The engaging portion 28 further extends to the fixing legs 24 to form a star-shaped configuration. The engaging portion 28 is devised for strengthening the locking plate 20 and engaging a bottom of the fin unit 30.

The fin unit 30 has a generally cylinder configuration, and comprises a plurality of fins 31 clasping each other to form a central hole 300 therein. The fin unit 30 is mounted around the outer circumferential surface of the heat conducting member 10 by mechanical coupling.

Figure 4:
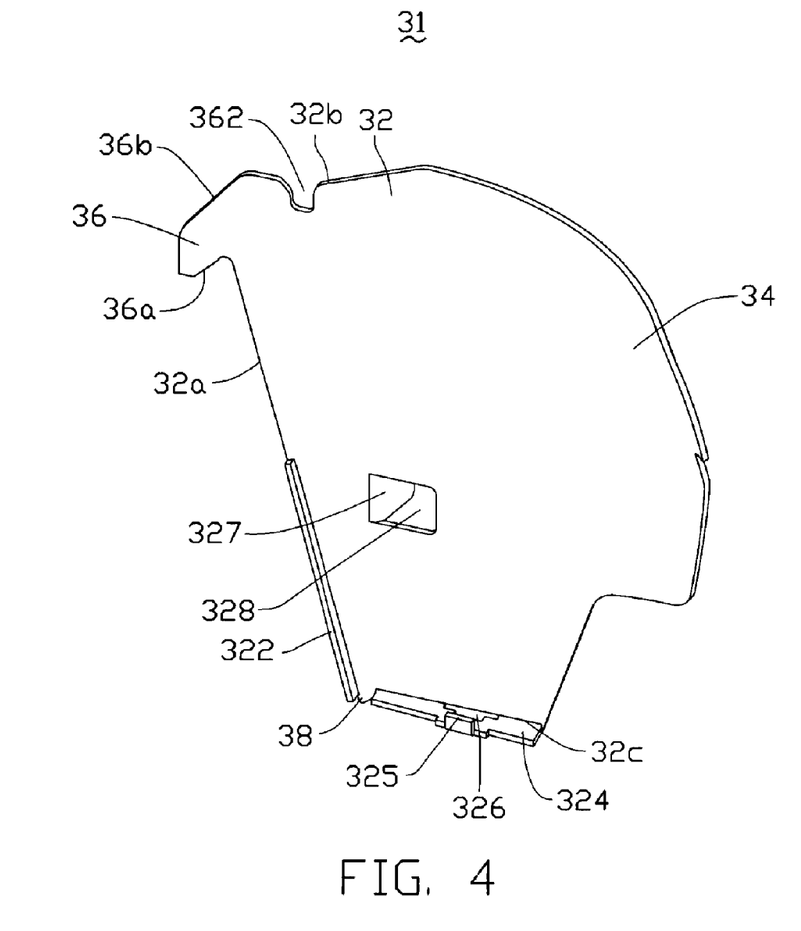
FIG. 4 is a perspective view of one fin of a fin unit of FIG. 1.
Figure 5:
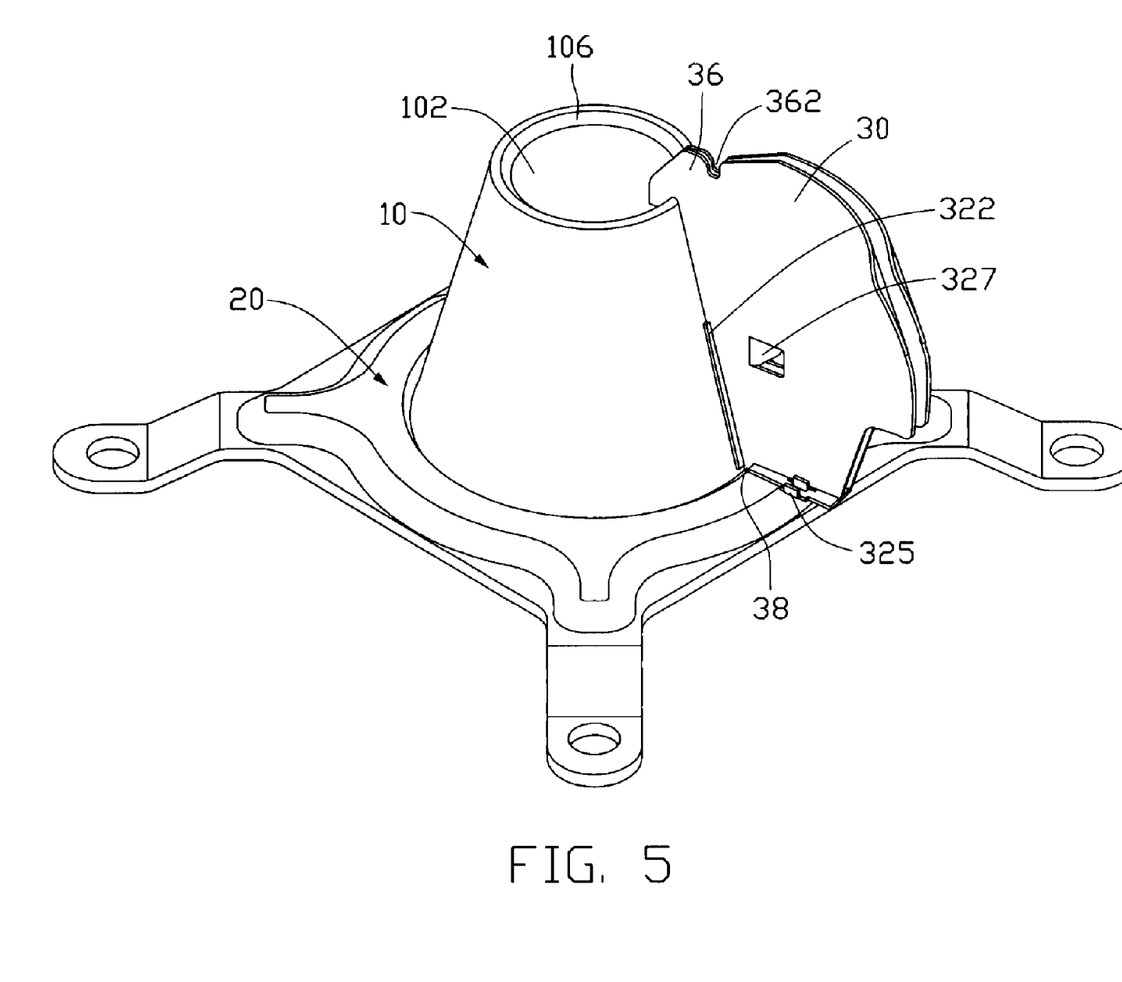
FIG. 5 is an assembled view of a locking plate, a heat conducting member and two fins of FIG. 1.

Please referring to FIG. 4-5, each of the fins 31 comprises a plane portion 32 and a curved portion 34 integrally extending from the plane portion 32. The curved portion 34 curves along a circumferential direction of the heat conducting member 10. The plane portion 32 comprises an inner inclined edge 32a abutting against the outer circumferential surface of the heat conducting member 10, an upper edge 32b connecting with the inner edge 32a and a lower edge 32c connecting with the inner edge 32a. A flange 322 is perpendicularly and forward bent from the inner edge 32a, for contacting with the outer circumferential surface of the heat conducting member 10. The flange 322 has a length shorter than that of the inner edge 32a and a width gradually increased along an up-bottom direction. A wing 324 is perpendicularly and forward bent from the lower edge 32c. The wing 324 has a width gradually enlarged from an end of the lower edge 32c adjacent to the inner edge 32a to another end of the lower edge 32c far away from the lower edge 32c along a length direction of the lower edge 32c. A tongue 325 is perpendicularly and upwardly bent from a front edge of the wing 324. A though hole 326 is defined in the wing 324 where the wing 324 is connected with the lower edge 32c of the plane portion 32. A locating tab 327 is stamped from a center of the plane portion 32 such that a locating hole 328 is defined corresponding to the locating tab 327. The tongue 325 of the fin 31 is inserted in the through hole 326 of an adjacent fin 31 and the locating tab 327 is inserted in the locating hole 328 of the adjacent fin 31 and abuts against the locating tab 327 of the adjacent fin 31 as two adjacent fins 31 are combined together. A protruding hook 36 is formed at a joint of the inner edge 32a and the upper edge 32b. The hook 36 protrudes beyond the inner edge 32a. The hook 36 has an arcuate edge 36a connecting with the inner edge 32a and a slant edge 36b connecting with the upper edge 32b. The arcuate edge 36a is used for engaging with the inclined surface 106 of the wall 104 of the heat conducting member 10. The upper edge 32b defines a cutout 362 adjacent to the hook 36. The cutouts 362 of the fins 31 form an annular channel 304 (shown in FIG. 6) for receiving the corresponding clip 40. A triangular nub 38 is formed at a joint of the inner edge 32a and the lower edge 32c, for inserting into the gap between the inner surface of the opening 26 and the outer circumferential surface of the heat conducting member 10.

Figure 6:
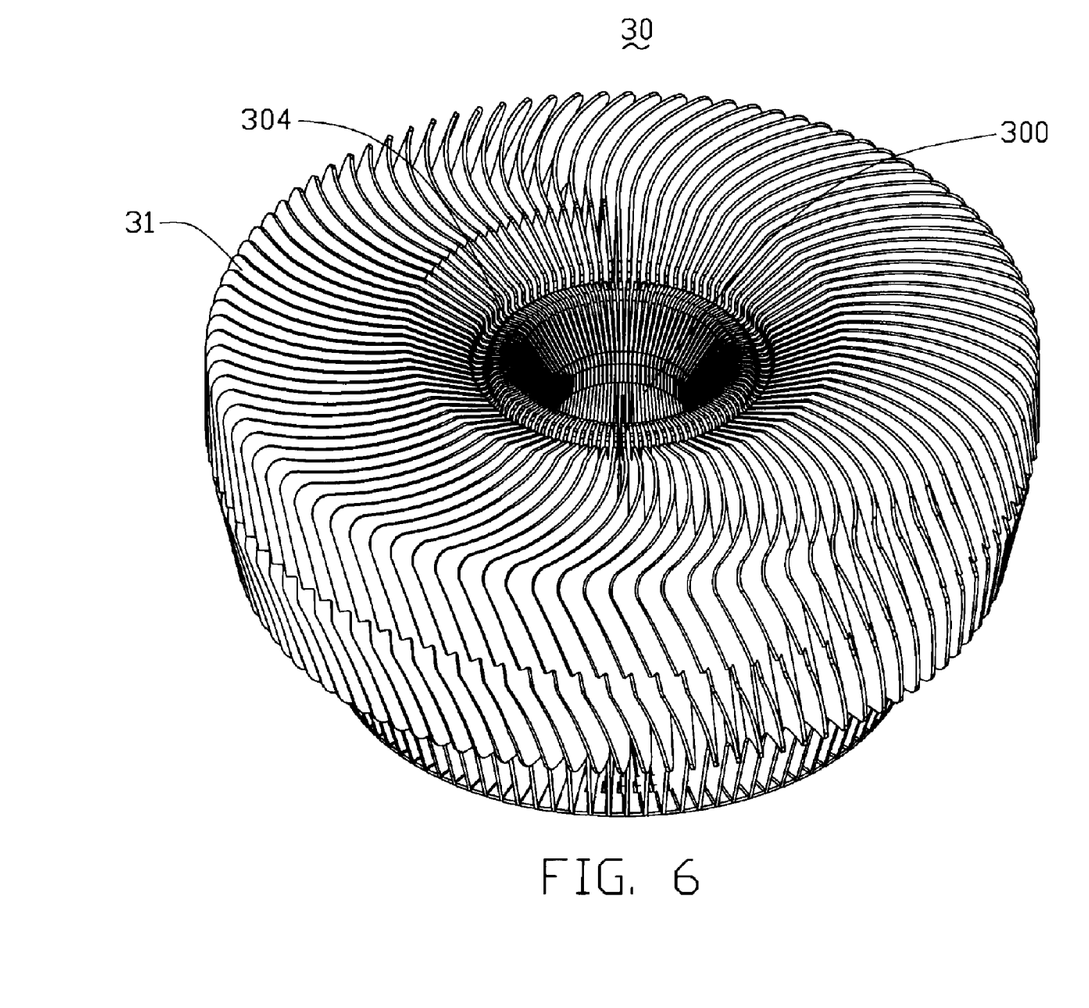
FIG. 6 is a perspective view of a fin unit of FIG. 1.
Figure 7:
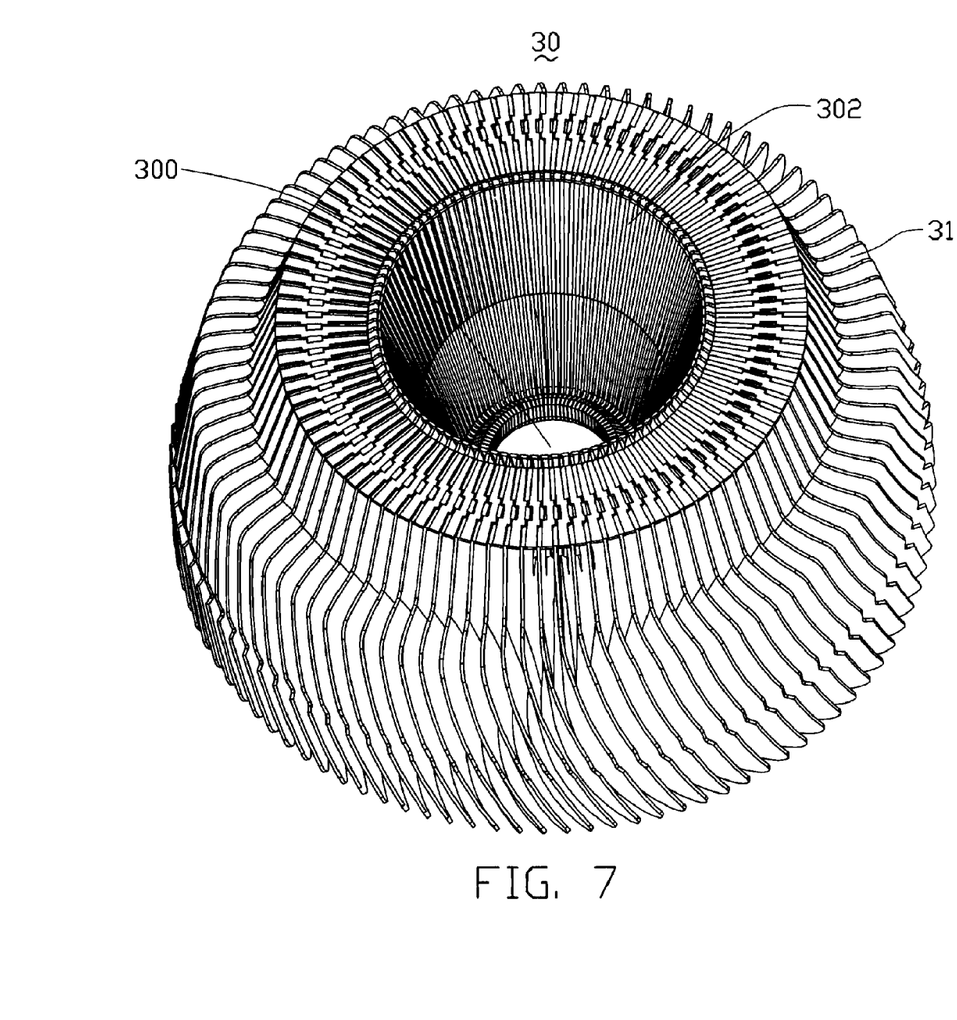
FIG. 7 is an inverted view of FIG. 6.

Please referring to FIGS. 6-7, the fin unit 30 is formed by the fins 31 clasping each other. The flanges 322 of the fins 31 cooperatively form a mating surface 302 mating with the outer circumferential surface of the heat conducting member 10. The plane portions 32 of the fins 31 are perpendicular to the outer circumferential surface of the heat conducting member 10. The curved portions 34 are bent obliquely respective to the plane portions 32. The curved portions 34 are used for allowing an airflow to flow through channels (not labeled) formed between the fins 31 and guiding the airflow to blow towards the bottom portion of the heat conducting member 10 and other electronic components around the heat dissipation device.

Again referring to FIG. 1 and FIG. 3, the clip 40 comprises a cap 42 and a screw 43 used for mounting the cap 42 on the heat conducting member 10. The cap 42 comprises a circular top plate (not labeled) having a concave portion 420 at a center thereof, and a lateral flange 422 extending downwardly from an edge of the top plate. The lateral flange 422 is engaged in the channel 304 of the fin unit 30. The concave portion 420 defines a through hole 421 at a center thereof, for permitting passage of the screw 43. Three spaced cuts 423 are defined in a top plate for facilitating a user to manipulate the cap 42 and increasing the resilience of the cap 42. The screw 43 comprises an expanded head 430 and a shaft 432 extending downwardly from the head 430. A distal end of the shaft 432 forms external threads.

In assembly of the heat dissipation device, the locking plate 20 is assembled to the heat conducting member 10 by fitting the heat conducting member 10 into the opening 26 of the locking plate 20 until a top face of the annular pad 12 of the heat conducting member 10 abuts the locking plate 20. The heat conducting member 10 has an interferential engagement with the body 22 so that the heat conducting member 10 and the locking plate 20 are securely connected together. Thereafter, the fin unit 30 is assembled to the heat conducting member 10 and rests on the locking plate 20 whereby the fins 31 surround the outer circumferential surface of the heat conducting member 10. The inner edges 32a of the fins 31 intimately engage with the outer circumferential surface of the heat conducting member 10. The arcuate edges 36a of the hooks 36 of the fins 31 abut against the inclined surface 106 of the wall 104 of the heat conducting member 10. The triangular nubs 38 of the fins 31 are inserted into the gap between the bottom of the outer circumferential surface of the wall 104 and the locking plate 20. The cap 42 is mounted on the top of the heat conducting member 10 after the fin unit 30 is assembled to the heat conducting member 10. The lateral flange 422 of the cap 42 is engaged in the channel 304 of the fin unit 30. The screw 44 passes through the through hole 421 of the cap 42 and extends into the opening 102 of the heat conducting member 10 and further threadedly engaged in the threaded hole 16 of the heat conducting member 10, whereby the fins 31 are downwardly pressed by the cap 42 to cause the fins 31 to intimately engage with the heat conducting member 10. Especially, in use of the heat dissipation device, a risk of a vibration by a fan to cause the connection between the fin unit 30 and the heat conducting member 10 to loose is prevented.

Figure 8:
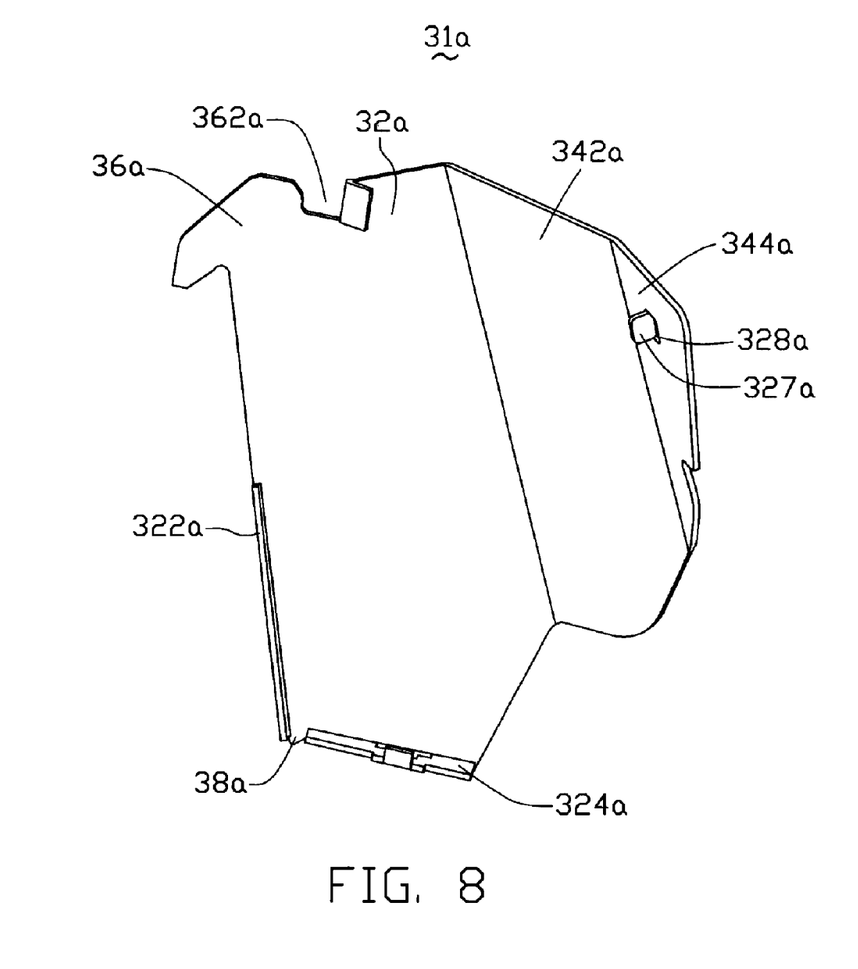
FIG. 8 is a perspective view of one fin of a heat dissipation device according to an alternative embodiment of the present invention.

Referring to FIG. 8, a heat dissipation device in accordance with an alternative embodiment of the present invention is shown. The heat dissipation device is similar to the heat dissipation device of the previous preferred embodiment, but a fin 31a replaces the fin 31 of the fin unit 30 of the previous preferred embodiment. The fin 31a comprises a plane portion 32a, a first bend portion 342a bent from the plane portion 32a and a second bend portion 344a slightly bent from an edge of the first bend portion 342a. The plane portion 32a is similar with the plane portion 32 of the preferred embodiment, and comprises a flange 322a, a wing 324a and a protruding hook 36a. A cutout 362a is defined adjacent to the hook 36a. A locating tab 327a is stamped from a center of the second bend portion 344a such that a locating hole 328a is defined corresponding to the locating tab 327a. The first bend portion 342a and the second bend portion 344a cooperately form a guide portion for guiding the airflow to blow toward the bottom of the heat conducting member 10.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:

a heat conducting member adapted for contacting a heat generating electronic device;

a fin unit having a central hole therein, the fin unit consisting of a plurality of fins around the central hole and clasping each other, the fin unit fitting around a periphery of the heat conducting member via the heat conducting member extending in the central hole of the fin unit;

a clip engaging with the heat conducting member and the fin unit for providing a pressure to the fin unit such that the fin unit is intimately fastened to the heat conducting member; and a locking plate mounted on a bottom of the heat conducting member and depressed by the fin unit, the locking plate being adapted for securing the heat dissipation device to a printed circuit board;

wherein the clip comprises a cap and a screw used for mounting the cap on a top of the heat conducting member, the screw threadedly engaging with the heat conducting member.

2. The heat dissipation device of claim 1, wherein the heat conducting member has a frustum configuration.

3. The heat dissipation device of claim 2, wherein an annular pad extends outwardly from an outer surface of a bottom of the heat conducting member, and the locking plate is mounted on the annular pad.

4. The heat dissipation device of claim 1, wherein the cap comprises a top plate having a concave portion at a center thereof, and a lateral flange extending downwardly from an edge of the top plate.

5. The heat dissipation device of claim 4, wherein the fin unit rests on the locking plate and defines an annular channel at a top thereof for receiving the lateral flange of the cap.

6. The heat dissipation device of claim 1, wherein the heat conducting member defines an opening in the top thereof.

7. The heat dissipation device of claim 6, wherein the opening of the heat conducting member has a radius gradually decreased along a top-bottom direction.

8. The heat dissipation device of claim 7, wherein the bottom of the heat conducting member defines a threaded hole located below the opening, and the screw of the clip passes through the opening and threadedly engages in the threaded hole of the heat conducting member.

9. The heat dissipation device of claim 1, wherein each of the fins comprises a plane portion and a curved portion integrally extending from the plane portion.

10. The heat dissipation device of claim 9, wherein the plane portion comprises an inner inclined edge abutting against an outer circumferential surface of the heat conducting member, an upper edge connecting with the inner edge and a lower edge connecting with the inner edge, the upper edges cooperatively defining a channel receiving a portion of the cap, the lower edges abutting against the locking plate.

11. The heat dissipation device of claim 10, wherein a flange is perpendicularly and forward bent from the inner edge, for contacting the outer circumferential surface of the heat conducting member.

12. The heat dissipation device of claim 10, wherein a wing is perpendicularly and forward bent from the lower edge, a tongue is perpendicularly and upwardly bent from a front edge of the wing, and a though hole is defined in the wing where the wing is connected with the lower edge of the plane portion, and the tongue of the each of the fins is used for being inserted in the through hole of an adjacent fin.

13. The heat dissipation device of claim 10, wherein a locating tab is stamped from a center of the plane portion such that a locating hole is defined corresponding to the locating tab, the locating tab of the each of the fins is used for being inserted in the locating hole of an adjacent fin and abuts against the locating tab of the adjacent fin.

14. The heat dissipation device of claim 10, wherein the heat conducting member has a wall having an inclined surface at an inner surface adjacent to a top thereof.

15. The heat dissipation device of claim 14, wherein a protruding hook is formed at a joint of the inner edge and the upper edge, the hook protrudes beyond the inner edge and has an arcuate edge connecting with the inner edge and a slant edge connecting with the upper edge, and the arcuate edge is used for engaging with the inclined surface of the wall of the heat conducting member.

16. The heat dissipation device of claim 15, wherein a nub is formed at a joint of the inner edge and the lower edge, for inserting into a gap between the bottom of the heat conducting member and the locking plate.

17. A heat dissipation device comprising:
a frustum-shaped heat conducting member having a bottom end larger than a top end thereof, the bottom end having a bottom face adapted for thermally connecting with a heat-generating electronic component;
a locking plate mounted on the bottom end of the heat conducting member, adapted for securing the heat dissipation device to a printed circuit;
a fin unit having a plurality of fins clasping each other, and having a central hole in which the conducting member is extended, the fins having inner edges surrounding the central hole and thermally engaging with a periphery of the heat conducting member, each of the fins having a first plane portion adjacent to the heat conducting member and a second portion bent from the first plane portion; and
a clip having a cap fitted on a top of the fin unit and a fastener extending through the cap to secure with the heat conducting member and press the fin unit downwardly against the locking plate.

18. The heat dissipation device of claim 17, wherein the second portion of each of the fins comprises two distinct bent sections.

* * * * *